United States Patent [19]

Tsunaga et al.

[11] Patent Number: 4,888,135
[45] Date of Patent: Dec. 19, 1989

[54] ELECTRICALLY CONDUCTIVE POWDER AND ELECTRICALLY CONDUCTIVE COMPOSITION USING THE SAME

[75] Inventors: Masayuki Tsunaga; Kazuaki Yuba, both of Saitama; Youichi Kaneko, Hiroshima, all of Japan

[73] Assignee: Mitsui Mining & Smelting Co., Ltd., Tokyo, Japan

[21] Appl. No.: 913,030

[22] Filed: Sep. 29, 1986

[51] Int. Cl.$^4$ .............................................. H01B 1/06
[52] U.S. Cl. ...................................... 252/512; 252/514; 252/518; 252/520; 428/403; 428/407; 523/512; 523/457; 523/459; 524/439
[58] Field of Search ................ 252/512, 520; 427/217; 524/439, 403, 413, 439; 428/403, 407, 570; 523/457, 459, 512

[56] References Cited

U.S. PATENT DOCUMENTS

| | | | |
|---|---|---|---|
| 4,305,847 | 12/1981 | Stoetzer et al. | 252/512 |
| 4,521,329 | 6/1985 | Suita et al. | 252/512 |
| 4,559,166 | 12/1985 | Morinaga et al. | 252/512 |
| 4,680,140 | 7/1987 | Kageyama | 252/512 |
| 4,687,597 | 8/1987 | Siuta | 252/512 |
| 4,705,647 | 11/1987 | Yamaguchi et al. | 252/512 |
| 4,716,081 | 12/1987 | Ehrreich | 252/512 |

FOREIGN PATENT DOCUMENTS

| | | |
|---|---|---|
| 53-135495 | 11/1978 | Japan . |
| 55-54502 | 4/1980 | Japan . |
| 56-8892 | 1/1981 | Japan . |
| 57-34606 | 2/1982 | Japan . |
| 57-96401 | 6/1982 | Japan . |

*Primary Examiner*—Josephine Barr
*Attorney, Agent, or Firm*—Albert L. Jeffers; John F. Hoffman; Lawrence A. Steward

[57] ABSTRACT

An electrically conductive powder having good stability against oxidation, good storage stability, good in anti-migratory action and capable of constituting electrically conductive composition having high electrical conductivity and good resistance to heat and the wet, may be constituted by copper particles, a silver coating material coating a part or the total of the copper particles and a titanate coupling agent combined to the copper particles and/or the silver coating material.

2 Claims, No Drawings

ELECTRICALLY CONDUCTIVE POWDER AND ELECTRICALLY CONDUCTIVE COMPOSITION USING THE SAME

FIELD OF THE INVENTION

The present invention relates to an electrically conductive powder and an electrically conductive composition using the same, which may be used for forming, for example, a conductor film in an electronic circuit.

BACKGROUND OF THE INVENTION

Silver conductive pastes which are widely used as electrically conductive materials for electronic circuits, have several drawbacks such as their high production costs and their tendencies of electrochemical migration in which electrode materials are ionized and move toward the counter electrode.

To remove these drawbacks, there is proposed the use of copper conductive paste instead of silver conductive paste. Since, the copper paste, however, is easily oxidized, it requires an anti-oxidant treatment such as follows.

Method (i): The addition of the reductive substance capable of reducing oxide cover film of copper powder or the use of the reductive resin [the Japanese Patent Open-laid Applications (hereinafter referred to as JPOA) Nos. 81/103260, 82/96401, 82/34060].

Method (ii) Coating of copper powder with silver (the JPOA Nos. 78/135495, 81/8892).

Since, however, in the Method (i), the copper powder itself is not subjected to anti-oxidant treatment, the copper powder or the paste containing such non-treated copper powder becomes unstable after it is stored for a long time. In the presence of a reductive substance, the cured film has insufficient resistivity against heat and the wet. When the conductor film is formed by the use of the reductive resins of the restricted kinds, it is hardly used in the multi-functional devices.

On the other hand, the Method (ii) requires much amount of silver (20% by weight in the case of the JPOA No. 78/135495, 10% by volume in the case of the JPOA No. 81/8892). Therefore, the composite copper powder becomes expensive and is lacking in anti-migratory action as well.

SUMMARY OF THE INVENTION

It is one object of the present invention to provide an electrically conductive powder which has good stability against oxidation as well as good storage stability, and is capable of maintaining high conductivity for a long time.

It is another object of the present invention to provide an electrically conductive powder which is inexpensive.

It is still another object of the present invention to provide an electrically conductive composition containing the electrically conductive powder having the above-mentioned advantages and good in resistivity against heat and the wet and free from electrochemical migration of the conductive powder contained.

The above objects of the present invention are accomplished by the electrically conductive powder of the present invention which comprises copper particles, a silver coating material coating a part or the total of the surface of copper particles and a titanate coupling agent combined to the copper particles and/or the silver coating material.

In accordance with the present invention, there is also provided an electrically conductive composition containing as chief ingredients an electrically conductive powder consisting of copper particles, a silver coating material coating a part or the total of the surface of the copper particles and a titanate coupling agent combined to the copper particles and/or the silver coating material, and a binder resin.

DETAILED DESCRIPTION OF THE INVENTION

The copper particles to be used in the present invention may be any type of the known powder particles such as dendritic powder, spherical powder and flaky powder. The size of the copper particle may be chosen from the sizes of the known copper particles used for an electrically conductive powder. That is, the mean particle diameter of the copper particles may be 0.5–40 μm, preferably 2–15 μm.

The silver coating material to be used in the present invention may be any type of silver-containing material which is capable of adhering to and coating the surface of the copper particles. The silver-containing material to be used as the silver coating material may consist essentially of silver or a silver compound such as a silver complex salt.

It may be used any known method for adhering a silver coating material to the surface of copper particles. Illustrative examples of such methods include the conventional methods of producing composite powder, a method comprising electrolytically replacing the surface portion of copper particles with silver in a solution of complex salt of silver as described in the JPOA No. 53-135495, a method comprising coating (plating) the surface of powder particles with a precious metal as described in the JPOA No. 55-54502, and a method comprising obtaining silver-coated powder particles in a solution of complex salt of silver and heating thus obtained silver-coated powder particles in hydrogen gas and/or an inert gas.

The amount of the silver coating material to be used may voluntarily be determined in consideration of specific surface of copper particles, thickness of silver coating material to be adhered and the proportion thereof to the size of copper particles. Since the silver coating material used in combination with the titanate coupling agent is more effective than used alone, it may be used in such a small amount as 0.1 to 8% by weight (with 0.01 to 5% by weight of the titanate coupling agent), in particular 0.1 to 5% by weight (with 0.01 to 2% by weight of the titanate coupling agent) of the electrically conductive powder of the present invention, and may bring good stability against oxidation, good electrical conductivity, good anti-migratory action and low cost to the electrically conductive powder of the present invention. When the content of the silver coating material surpasses 8% by weight, anti-migratory action of the electrically conductive powder weakens. When the content of the silver coating material is less than 0.1% by weight, stability of the electrically conductive powder against oxidation is insufficient.

The titanate coupling agent to be used in the present invention is a coupling agent containing as an efficacious component a complex salt of titanium which is capable of being combined with the copper particles and/or the silver coating material. The complex salt of titanium having hydrophilic group and oleophilic group combined to the central titanium atom, in particular those having one or more hydrophilic groups selected from monoalkoxy group, radical of oxy acetic acid, radical of ethylene glycol and phosphite group, may preferably be used as the titanate coupling agent.

Preferable examples of the titanate coupling agent include titanate coupling agent containing isopropyl triisostearoyl titanate (coming into the market as the trade name of KR-TTS, manufactured by Ajinomoto Co., Inc.), bis(dioctyl pyrophosphate)oxyacetate titanate (coming into the market as trade name of KR-138S, manufactured by Ajinomoto Co., Inc.), bis(dioctyl pyrophosphate)ethylene titanate (coming into the market as trade name of KR-238S, manufactured by Ajinomoto Co., Inc.).

The amount of the titanate coupling agent to be used may preferably be 0.01 to 5% by weight, more preferably 0.01 to 2% by weight, still more preferably 0.05 to 1% by weight of the electrically conductive powder. When the amount of the titanate coupling agent surpasses 5% by weight, the electrical conductivity of the electrically conductive powder become unsatisfactory.

It may be used any known method for combining the titanate coupling agent to the copper particles and/or the silver coating material. Illustrative examples of such methods include a method comprising subjecting a solution of complex salt of titanium to be in contact with a composite powder comprising the copper particles and the silver coating material coating a part or the total of the surface of the copper particles, and a method comprising simultaneously taking place the adhesion of the silver coating material and combination of complex salt of titanium by subjecting a solution containing complex salt of titanium and the silver covering agent to be in contact with the copper particles.

The electrically conductive composition of the present invention may comprise an electrically conductive powder of the present invention and a binder resin and may be in the form of a conductive paste used for the formation of coating film consisting of electrically conductive powder and a resin matrix. There may be used any usual agent used in addition to the binder resin. Illustrative examples of such agents include curing agent (hardener), cross-linking agent, catalyst, solvent, filler, colorant, an agent for improving processability of film-applying, an agent for improving processability of screen printing and the like.

The binder resin to be used in the electrically conductive composition of the present invention may be selected from the thermo-setting and thermoplastic resins (including modified resins) which may be used as a vehicle resin to form a coating film. Preferred examples of the binder resin include phenolic resins, epoxy resins, acrylic resins, polyester resins and olefin resins. The ingredients other than the binder resin such as a curing agent and a solvent and energy source used for taking place curing (cross-linking) reaction may voluntarily be chosen in consideration of the type of the biner resin to be used.

The proportion of the amounts of the electrically conductive powder and the binder resin to be used in the electrically conductive composition of the present invention may be chosen from rather broad range in accordance with the use of the electrically conductive composition. It is, however, preferred to choose the amount of 5 to 50 parts by weight, more preferably 25 to 40 parts by weight of the solid content of the binder resin to 100 parts by weight of the electrically conductive powder.

The present invention is described more in detail by the following Examples and Comparative Examples.

EXAMPLES 1 THROUGH 6, COMPARATIVE EXAMPLES 1 THROUGH 4

Electrically conductive powders were prepared by using dendritic copper powder (mean particle diameter 4 μm, manufactured by Mitsui Mining & Smelting Co., Ltd.), silver covering material (electrolytically replacing the copper surface) and the titanate coupling agent (Trade name: KR-138S, manufactured by Ajinomoto Co., Inc.) in the amounts as shown in Table I.

Then the film-forming compositions were prepared by mixing 52 parts by weight of each of thus obtained electrically conductive powder, 37 parts by weight of alcohol-soluble phenolic resin (Trade Name: PL-2210, manufactured by Gunei Kagaku Kabushikikaisha, Solid resin content: 60% by weight) and 11 parts by weight of butyl cellosolve, and kneading thus prepared mixture by means of a roller mill.

Thus obtained ten film-forming compositions were subjected to screen printing using 250 mesh stainless screen to form coating films in the form of a conductor circuit. Then the coating film were heated and cured at 150° C. for 30 minutes in the atmosphere.

The thus obtained cured films were subjected to measurements of specific resistance (primary stage, after wet treatment (aging) at 60° C., 95% RH for 1000 hours). In addition, the above-mentioned electrically conductive powders as prepared were subjected to measurements of color and specific resistance thereof after the wet treatment at 40° C., 95% RH for 96 hours, contact resistance thereof (*1), and a time before the starting of migration (*2). The results were shown in Table I.

(*1) Two cured films were formed so as to cross perpendicular to each other. Then the specific resistance ($\rho$) across the Ag electrodes and the specific resistance ($\rho Cu$) on the cured film were measured. The contact resistance $R_C$ was calculated based on the following equation.

$$R_C = \frac{\rho Ag}{\rho Cu}$$

(*2) The time from dropping of 10 μl deionized water and charging of 15 VDC between two cured films parallel to each other (pitch: 1.2 mm) till occurrence of shortage.

TABLE I

|  |  | Comparative Example No. | | | | Example No. | | | | | |
| --- | --- | --- | --- | --- | --- | --- | --- | --- | --- | --- | --- |
|  |  | 1 | 2 | 3 | 4 | 1 | 2 | 3 | 4 | 5 | 6 |
| Electrically | Ag (%) | 0 | 0 | 1 | 20 | 0.5 | 0.5 | 1 | 1 | 3 | 3 |
| Conductive | Titanate | 0 | 0.5 | 0 | 0 | 0.1 | 0.5 | 0.1 | 0.5 | 0.1 | 0.5 |
| Powder | Coupling |  |  |  |  |  |  |  |  |  |  |
|  | Agent (%) |  |  |  |  |  |  |  |  |  |  |

TABLE I-continued

| | | Comparative Example No. | | | | Example No. | | | | | |
|---|---|---|---|---|---|---|---|---|---|---|---|
| | | 1 | 2 | 3 | 4 | 1 | 2 | 3 | 4 | 5 | 6 |
| Specific Resistance of Cured Film ($10^{-4}$ Ω cm) | Primary Stage | >$10^4$ | >$10^4$ | 1.5 | 2.8 | 2.3 | 3.3 | 1.8 | 2.6 | 2.1 | 2.9 |
| | After Aging (*1) | >$10^4$ | >$10^4$ | 2.8 | 3.0 | 3.6 | 3.7 | 2.1 | 2.8 | 2.6 | 3.3 |
| Wet Treatment of Electrically Conductive Powder (*2) | Color of Electrically Conductive Powder | Black | Unchanged | Black | Unchanged | Slightly changed | Unchanged | Unchanged | Unchanged | Unchanged | Unchanged |
| | Specific Resistance of Cured Film ($10^{-4}$ Ω cm) | >$10^4$ | >$10^4$ | >$10^4$ | 3.1 | 6.4 | 6.6 | 3.2 | 4.2 | 2.7 | 3.5 |
| Contact Resistance $\rho Ag/\rho Cu$ | | — | — | 0.9 | 1.0 | 1.1 | 1.3 | 1.0 | 1.3 | 1.0 | 1.2 |
| Time before the Starting of Migration (sec) | | — | — | 420 | 190 | 510 | 520 | 430 | 430 | 390 | 395 |

(*1) 60° C., 95% RH, 1000 hr.
(*2) 40° C., 95% RH, 96 hr.

In addition, the electron microanalysis of the electrically conductive powder prepared in Example 4 shows uniform dispersion of Ag and Ti on the surface of the copper particles.

What is claimed:

1. An electrically conductive composition comprising: an electrically conductive powder consisting of copper particles in an amount 87.0–99.89% by weight, a silver coating material coated on a part or the total of the surface of the copper particles in an amount 0.1–8.0% by weight, and a titanate coupling agent combined to the copper particles and silver coating in an amount 0.01–5.0% by weight; and a binder resin in an amount 5.0–50.0% by weight of the amount of the electrically conductive powder, wherein the binder is selected from the group consisting of a phenolic resin, epoxy resin, acrylic resin, polyester resin and olefin resin.

2. The electrically conductive composition as claimed in claim 1, in which said electrically conductive powder contains 93 to 99.89% by weight of said copper particles, 0.1 to 5% by weight of said silver coating material and 0.01 to by weight of said titanate coupling agent.

* * * * *